(12) United States Patent
Saraswat et al.

(10) Patent No.: US 9,513,692 B2
(45) Date of Patent: Dec. 6, 2016

(54) HETEROGENOUS MEMORY ACCESS

(71) Applicants: Ruchir Saraswat, Swindon (GB);
Matthias Gries, Braunschweig (DE);
Nicholas P. Cowley, Wroughton (DE)

(72) Inventors: Ruchir Saraswat, Swindon (GB);
Matthias Gries, Braunschweig (DE);
Nicholas P. Cowley, Wroughton (DE)

(73) Assignee: Intel Corporation, Santa Clara, CA (US)

( * ) Notice: Subject to any disclaimer, the term of this patent is extended or adjusted under 35 U.S.C. 154(b) by 308 days.

(21) Appl. No.: 14/030,515

(22) Filed: Sep. 18, 2013

(65) Prior Publication Data

US 2015/0082062 A1    Mar. 19, 2015

(51) Int. Cl.
*G06F 1/32*     (2006.01)
*G06F 3/06*     (2006.01)
*G06F 12/02*    (2006.01)

(52) U.S. Cl.
CPC ........... *G06F 1/3275* (2013.01); *G06F 3/0625* (2013.01); *G06F 3/0644* (2013.01); *G06F 3/0685* (2013.01); *G06F 12/02* (2013.01); *G06F 12/0246* (2013.01); *G06F 2212/7201* (2013.01); *G06F 2212/7202* (2013.01); *G06F 2212/7211* (2013.01); *Y02B 60/1225* (2013.01)

(58) Field of Classification Search
None
See application file for complete search history.

(56) References Cited

U.S. PATENT DOCUMENTS

| | | | |
|---|---|---|---|
| 2008/0198651 A1* | 8/2008 | Kim | G06F 12/0246 365/185.03 |
| 2008/0276051 A1* | 11/2008 | Renno | G06F 12/1441 711/154 |
| 2009/0132621 A1* | 5/2009 | Jensen | G06F 3/061 |
| 2009/0254702 A1 | 10/2009 | Kumano et al. | |
| 2010/0138677 A1 | 6/2010 | Pagan et al. | |

(Continued)

FOREIGN PATENT DOCUMENTS

| | | |
|---|---|---|
| JP | 2005216053 | 8/2005 |
| JP | 2008040606 | 2/2008 |

(Continued)

*Primary Examiner* — Daniel Tsui
(74) *Attorney, Agent, or Firm* — Chapin IP Law, LLC

(57) ABSTRACT

A memory controller operable for selective memory access to areas of memory exhibiting different attributes leverages different memory capabilities that vary access speed, retention time and power consumption, among others. Different areas of memory have different attributes while remaining available to applications as a single contiguous range of addressable memory. The memory controller employs an operating mode that identifies operational priorities for a computing device, such as speed, power conservation, or efficiency. The memory controller identifies an area of memory based on an expected usage of the data stored in the area, for example an access frequency indicating future retrieval. The memory controller therefore selects areas of memory based on the operating mode and the expected usage of data to be stored in the area according to a heuristic that favors areas of memory based on those exhibiting attributes having a high correspondence to the expected usage of the data.

23 Claims, 7 Drawing Sheets

(56) References Cited

U.S. PATENT DOCUMENTS

| | | | |
|---|---|---|---|
| 2012/0224425 A1 | 9/2012 | Fai et al. | |
| 2012/0323977 A1 | 12/2012 | Fortier et al. | |
| 2013/0275665 A1* | 10/2013 | Saraswat | G11C 7/04 |
| | | | 711/106 |

FOREIGN PATENT DOCUMENTS

| | | |
|---|---|---|
| JP | 2009048613 | 3/2009 |
| JP | 2009064112 | 3/2009 |
| JP | 2011022933 | 2/2011 |
| JP | 2011095974 | 3/2011 |
| TW | 201301040 | 1/2013 |
| TW | 201306032 | 2/2013 |

* cited by examiner

HETEROGENOUS MEMORY ACCESS

BACKGROUND

Computer systems employ main memory, or RAM (random access memory) for access during program (application) execution, and disk memory (mass storage), typically for saving/retrieving whole programs and writing data files needing storage beyond the current execution. Often these types are labeled as volatile and non-volatile storage, referring to the need for constant power to preserve stored values in main memory, while disk memory is employed for persistent storage of programs and data. Access methods to each of these types also differ fundamentally, as volatile memory is accessed by program instructions while disk memory relies on the input/output (I/O) subsystem of the computer. While the volatile memory is generally faster, such memory is referenced as a single block of homogeneous memory locations, such that a memory controller stores and retrieves from arbitrary available locations of substantially similar operating performance.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
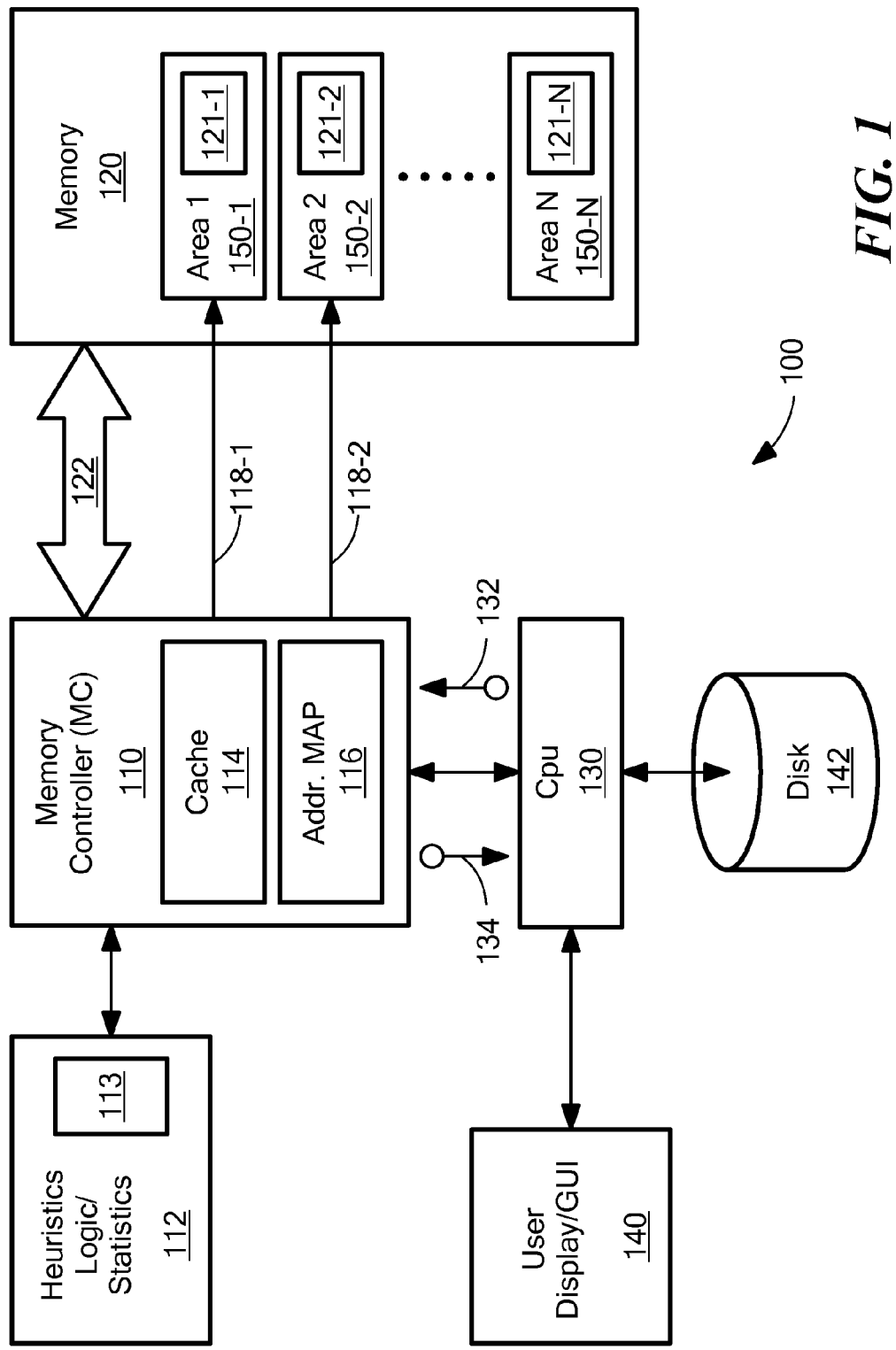
FIG. 1 is a context diagram of a computer memory environment suitable for use with configurations herein.

A memory controller operable for selective memory access to areas of volatile and non-volatile memory, each exhibiting different attributes, leverages different memory capabilities that vary access speed, retention time and power consumption, to name several. Different areas of memory have different attributes while remaining available to applications as a single contiguous range of addressable memory. The memory controller employs an operating mode that identifies operational priorities for a computing device, such as speed, power conservation, or efficiency (i.e. minimizing heat/power drain). The memory controller identifies an area of memory based on an expected usage of the data stored, for example an access frequency indicating when the data will be retrieved. Other factors may also be employed, such as sensors or counters to identify frequently used areas of memory, which may lead to temperature concerns. In this manner, the memory appears as a single, contiguous bank of memory to the applications, such that the applications need not identify the area (in contrast to conventional volatile/non-volatile access instructions). The memory controller selects areas of memory based on the operating mode and the expected usage according to a heuristic that favors areas of memory based on those exhibiting attributes having a high correspondence to the expected usage of the data.

It is likely that DRAM will be displaced by byte addressable non-volatile memory (NVM) including, but not limited to ferroelectric random-access memory (FeTRAM), nanowire-based non-volatile memory, three-dimensional (3D) crosspoint memory such as phase change memory (PCM), memory that incorporates memristor technology, Magnetoresistive random-access memory (MRAM) and Spin Transfer Torque (STT)-MRAM. These NVMs, and volatile memory such as Dynamic Random Access Memory (DRAM), can be tuned and manufactured for a wide range of retention times (from microseconds to years of retention of information). Similarly wide ranges surface for performance and power operating points of these memory technologies, ranging from deeply embedded low performance usages to high performance deployments, where, for instance, retention time and thermal burden (e.g. heat) can be traded off for better performance. Configurations herein take advantage of different performance, retention, and thermally optimized memory areas in order to dynamically adapt to operating points of the system, such as longest standby time on battery, high responsiveness during active phases, and best peak performance.

Memory areas (volatile and/or non-volatile) can be arranged in any suitable manner, for example within a single die, stacked (in packages), or in separate packages. Further, the disclosed methods may be employed with any suitable memory technology responsive to the attribute recognition and selective invocation based on the attributes. The memory controller (MC) plays a central role in orchestrating the access to the selection of memory areas to store data, since the areas may either be statically optimized (e.g., at manufacturing time) or dynamically by, e.g., configuring voltage rails. The MC's new functionality may include moving data between memory areas autonomously based on sensor input, statistic counters and timers, such that memory accesses can be served best according to a current operating mode (such as best performance or lowest power). Such a solution offers fine-grain control over power/thermals, performance and retention time of the memory subsystem.

Conventional MCs treat memory as one homogeneous area with predefined, static properties for performance and efficiency. Thermal events lead to throttling the number of accesses to this memory area with a negative impact on performance since accesses cannot be offloaded to other memory areas. In conventional approaches, retention time is currently not considered as design objective since the entire memory subsystem is considered volatile. Conventional performance states for memory are coarsely grained, operating only on the entire homogeneous memory area and only seldom reconfigured (if at all).

Memory subsystems having heterogeneous capabilities are expanding to encompass technologies such as DRAM, DRAM and NVM concurrently as volatile RAM. Current evolution of persistent memory exposes load/store byte addressable NVM to the programmer as a persistent tier in the platform architecture. However the burden is put on the programmer to place conventional data either in volatile or persistent memory/non-volatile memory to handle different operating points. In addition, conventional persistent memory only defines one level of retention time (unlimited), and does not permit tuning a trade-off between retention time for performance and thermal properties.

Configurations herein are based, in part, on the observation that conventional approaches to addressable memory define a monolithic block of consecutive addresses. Conventional memory controllers access memory as a homogenous storage area that does not distinguish or partition the memory for performance or efficiency attributes. Unfortunately, conventional approaches to memory controller based access suffer from the shortcoming that only a single tier, or category, of non-volatile storage is offered, and applications must select from either volatile or non-volatile (e.g. disk) storage.

Accordingly, configurations herein substantially overcome the above described shortcomings to memory access by providing a heterogeneous arrangement of different areas, or portions, of memory, each having different attributes for features such as access speed (performance), retention time, and power consumption. A memory is selectable for storage of data based on an expected usage of the data and a perceived need for particular attributes. For example, data which is frequently used or part of a fast response context may be stored in a fast retrieval memory area, while data that is expected to not be needed for a time could be stored in a high retention time area because slower access may be tolerated.

In configurations herein, the memory controller (MC) controls and selects a memory area that can be distinguished by attributes including performance, retention time, and energy efficiency. The MC can tune the operating points of the memory areas in terms of performance, efficiency and retention time depending on platform-level policies for these attributes and based on sensor input (such as thermal effects), statistic counters (e.g. frequency of access and address distribution) and further factors such as timeout counters. The MC's access heuristics can take advantage of these different operating modes. In addition, the MC may move content/data from one memory area to another triggered by the above sensorial and statistical/measured input to improve the overall behavior of the memory subsystem according to a platform-level policy. The heuristic logic implements access techniques that utilize iterative evaluation of feedback to improve performance and correlation of attributes to appropriate, or best-matched memory areas.

The memory may be divided into the performance and power areas or areas with higher retention time either during the production, by circuit architecture, or dynamically during run-time if enough flexibility is exposed by the circuit architecture to modify the attributes of the different areas.

The disclosed memory controller differs from a cache memory controller because the cache memory controller does not select different areas in cache memory based on expected usage; all data is a candidate for caching based on the same criteria, typically most recently or most frequency used. Further, the disclosed memory controller differs from architectures having only volatile and non-volatile storage because accesses to volatile and non-volatile storage are explicitly specified, i.e. by variable assignment or a file operation. While the selection between conventional volatile and non-volatile storage is usually application defined depending on the data usage, applications have no control over non-volatile storage, and a conventional memory controller merely allocates memory as a single block of the homogeneous volatile memory. It should further be noted that the operation and approaches outlined herein are equally applicable to an architecture exhibiting a plurality of memory controllers, in a hierarchical or parallel arrangement. Therefore, the selection of a memory area is called for by the storage operation. There is no mapping to one area or another based on an expected usage.

FIG. 1 is a context diagram of a computer memory environment suitable for use with configurations herein.

Referring to FIG. 1, in the computer memory environment 100, a memory controller 110 controls access to the memory 120. The memory controller 110 is responsive to one or more CPUs 130 for requests 132, and provides responses 134, to store and retrieve data items (data). The CPU 130 is also responsive to a user display and GUI (Graphical User Interface) 140 for receiving user input and rendering output for executed applications. A disk 142 or other long term/non-volatile storage medium may also be included, depending on the size and portability of the memory environment, discussed further below.

The memory 120 includes a plurality of areas 150-1 . . . 150-N (150 generally), and is accessible (read/write) by the memory controller (MC) 110 via an access medium 122 Any suitable access medium, such as a parallel or serial bus employing an electrical or optical transfer, and alternatively coupled to Through Silicon Vias (TSV), as in a stacked implementation, discussed further below. The MC 110 selects areas 150 of memory in which to store data according to the requests 132, and retrieves from the same location to fulfill the response 134. Controller logic 112 stores and applies heuristics for computing applicable areas 150 in which to store data, as well as statistics concerning attributes of the areas 150-N. The memory areas 150 may also include sensors 121-1 . . . 121-N (121 generally), for aspects such as temperature and access counts. A sensor hub 113 in the heuristic logic aggregates the sensor 121 input as well as other pertinent factors from a variety of suitable sources such as location, temperature, humidity, attention of the user determined by front camera, and others.

The disclosed heterogeneous memory approaches and corresponding heuristics are interoperable with a cache and/or page map, which are typical in modern operating systems. Therefore, the memory controller 110 may also include a cache 114 and/or address map 116, operable in conjunction with configurations herein. For example, a cache controller and array may employ one or more of the areas in memory as a cache array, thus avoiding an additional memory device or bank for dedicated cache memory.

The cache 114, as is known in the art, stores data recently read from memory 120 and optionally, data recently written to memory 120 so that subsequent operations to the same data are facilitated. Selection of memory areas 150 as disclosed herein differs because the cache 114 looks only to the immediacy of the I/O operation, and not to intended usage or usage patterns based on a heuristic. However, part of the selection of memory areas may include an area having high speed attributes, and may include frequency or recency of use as part of the selection logic. Similarly, a paging mechanism merely collects sections of memory (e.g. pages, such as 4K) as the read/write multiple, and is thus applicable to the disclosed heuristic when data occurs on a particular page. For example, optional page attributes can reflect requirements specified by the programmer in terms of performance and retention for the associated page. The memory controller 110 may employ this information as guidance to map data to an area with equal or better attributes. Such a mechanism permits interaction with the programmer, in addition to autonomous MC 110 operation as disclosed herein.

The address map 116 may take the form of mappings employing software support or more hardware based approaches. In an implementation that employs software support, configurations may rely on an Operating System (OS) page table walk. On the other hand, the MC 110 may independently (autonomously) use a separate table to track address mappings (since the controller has the ability to move content). Virtually, this infrastructure for mapping/translating addresses in hardware can be shared with wear-leveling mechanisms for NVM, since wear-leveling often tracks write accesses per address (e.g., page) explicitly and moves content based on limited endurance.

It should be emphasized that each area 150 of the partitioned memory 120 remains addressable from the memory controller 110 in the same manner (i.e. word or byte addressable) without regard to the memory area 150 in which the data is stored. The application making the request 132 (and hence the programmer/developer building the application) need not distinguish different ranges of memory or otherwise indicate an area selection. The entire range of user/application memory 120 remains addressable. Therefore, the data is storable and retrievable from any of the plurality of areas 150 without explicit identification of the area from which the retrieval is performed. It should also be noted that "partition" as employed herein refers to the subdivision of the memory 120 into concurrently addressable areas 150, and not to separate operating systems installed on a single machine, which are typically cast into mutually exclusive environments supported by a disk partition.

The computer memory environment 100 may be any suitable computing platform, such as hand-held smartphones and portable computing devices, tablets, laptops, as well as desktop form factors. Physical constraints may affect operating parameters of the varying devices, for example smaller devices may tend to generate more heat, due to compactness, or may have a greater need to conserve power due to battery constraints. Smaller devices may not have a physical disk drive 142, although all devices likely have a persistent (non-volatile) component at least for startup/boot, although network booting is also possible.

Figure 2:
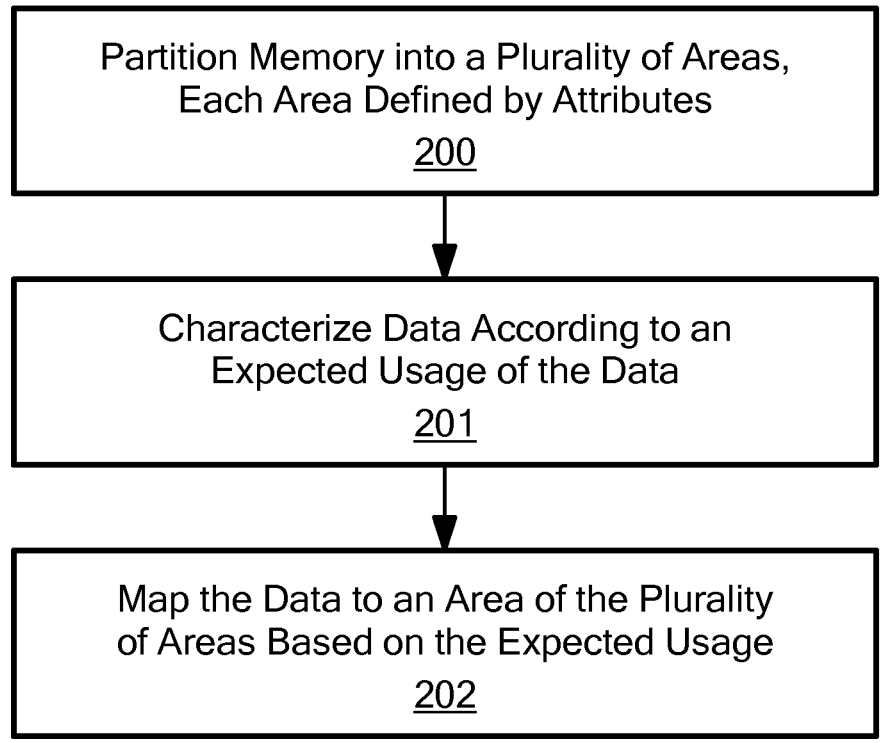
FIG. 2 is a flowchart of memory access in the computer memory environment of FIG. 1.

FIG. 2 is a flowchart of memory access in the computer memory environment of FIG. 1. Referring to FIGS. 1 and 2, in a particular configuration discussed further below, the method for accessing memory includes partitioning memory into a plurality of areas 150, such that each area 150 is defined by attributes, as disclosed at step 200. Each area may be any suitable area 150 of the memory 120, and may have attributes fixed from design or may have dynamic attributes which may be modified during execution, as shown by arrows 118-1 . . . 118-2 (118 generally), for issuing commands to the memory areas to modify attributes such as voltage for reducing power consumption or increasing access speed, for example. In the example configuration, the attributes include performance (speed), retention, and efficiency (power consumption). Other attributes may be employed depending on the design and support of the memory 120.

The heuristic logic 112 characterizes the data according to an expected usage of the data, as shown at step 201, and maps the data to an area 150 of the plurality of areas 150-N based on the expected usage, and/or in conjunction with a correlation of the attributes of the area, as depicted at step 202. In the example shown, the mapping, or correlation, between the attributes and the expected usage is performed such that the performance attribute identifies the speed with which the data is recalled from an area of memory, and is employed for data frequently accessed in timing sensitive computations. This attribute is favored when user response is paramount and power and temperature resilience are ample. The retention attribute identifies the duration which the data will remain in the area of memory without a power refresh, and is employed for data infrequently accessed in latency tolerant computations, for example for computation results which are not needed immediately, or those which are statistically accessed infrequently, discussed further below. The efficiency attribute indicates a power consumption for maintaining the data in the area of memory, and is employed when heat or battery considerations limit memory access. Thus, efficiency is a two-pronged feature referring to acceptable speed with limited power drain and heat generation. Efficiency is significant in portable devices where space tolerances can aggravate thermal build-up and battery power drain is a concern.

Sets of attributes may be bundled according to an operating mode indicative of a general context, and may set "corridors," or ranges for the attributes deemed acceptable for the operating mode. The operating mode therefore prioritizes the areas for usage based on the attributes, in which the operating modes include a performance mode, favoring memory areas having a fast retrieval, an efficiency mode favoring areas having low power consumption with an acceptable retrieval time, and a resilience mode favoring areas having high retention times for maintaining operation with minimal power and thermal stress while maintaining responsiveness. Other operating modes collecting other attributes, and/or specifying different corridors within an attribute range may also be invoked.

In particular configurations, the memory areas are configured to modify attributes during runtime in response to computed or expected usage. Therefore, the controller 110 may be responsive to the heuristic logic 112 for dynamically modifying the attributes of the area 150 in response to the expected usage. For example, memory that is needed infrequently may benefit from identifying an access period and a retention period of area of memory, and modifying a voltage attribute of the area such that the voltage is lower during the retention period for maintaining the data and the voltage is higher during the access period for fast retrieval of the data. Accordingly, relatively low power is needed during an extended latency of the data, and heat generation minimized, however when the data is needed, voltage is increased to permit fast access during the access period.

Similarly, data may be moved between areas 150 having the desired attributes. The heuristic logic 112 identifies a future access period for data stored in the area 150 of memory, and movies the data to an alternate area 150 of memory prior to the access period, in which the alternate area has attributes corresponding to fast access in response to data having infrequent use but a need for fast access during use.

In another example, it may be determined that an area of memory is experiencing a high operating temperature, due to frequency or density of access. In response, the heuristic logic 112 identifies the high temperature of an area 150 of memory, and modifies the attributes of the area 150 for reducing power consumption and heat generation in response to the identified high temperature, thus allowing the same area 150 to continue use but with attributes resulting in lower power and temperature.

FIGS. 3a-3d are a computation and data flow depicting a heuristic of memory access of the environment of FIG. 1. Generally, the heuristic logic 112 (logic) monitors a value or state of the attributes and performs corrective measures to redistribute memory usage to another area 150 to bring the attributes back within the operating corridor of the operating mode. Referring to FIGS. 1 and 3a-3d, at step 300, the logic 112 monitors a period data access or memory area access to identify infrequently used areas or data. A check is performed, at step 303, to determine if a monitored attribute exhibits a delay outside the operating corridor in the current profile. If so, then the memory controller 110 (or a subordinate management function such as DMA or address mapper processes) moves the data to an area 150 (portion) of the memory 120 with different retention according to the operating profile, as depicted at step 302, to more closely match the time between accesses. Therefore, if a data item is not accessed for an extended period, it may be tolerated to store in an area 150 with longer retention time to derive a benefit from reduced power. Control reiterates at step 300 according to a monitoring or polling cycle. Mapping based on the expected usage may therefore further include invoking a heuristic for receiving sensor feedback on a temperature of frequently accessed areas 150, and redirecting memory usage to less frequently used areas 150 based on the received sensor feedback.

Figure 3A:
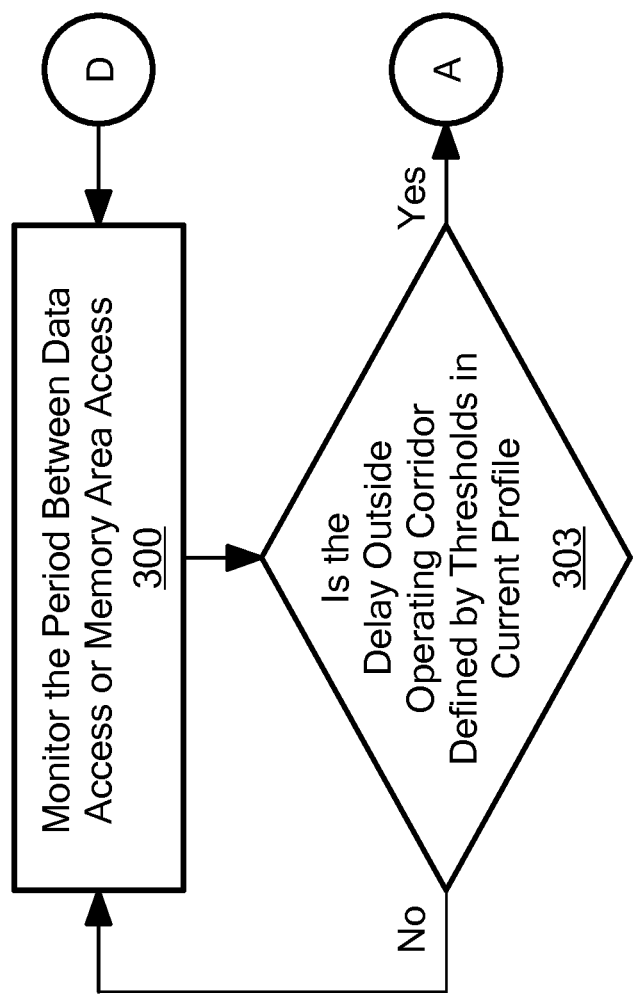
FIGS. 3a-3d are a computation and data flow depicting a heuristic of memory access of the environment of FIG. 1.
Figure 3B:
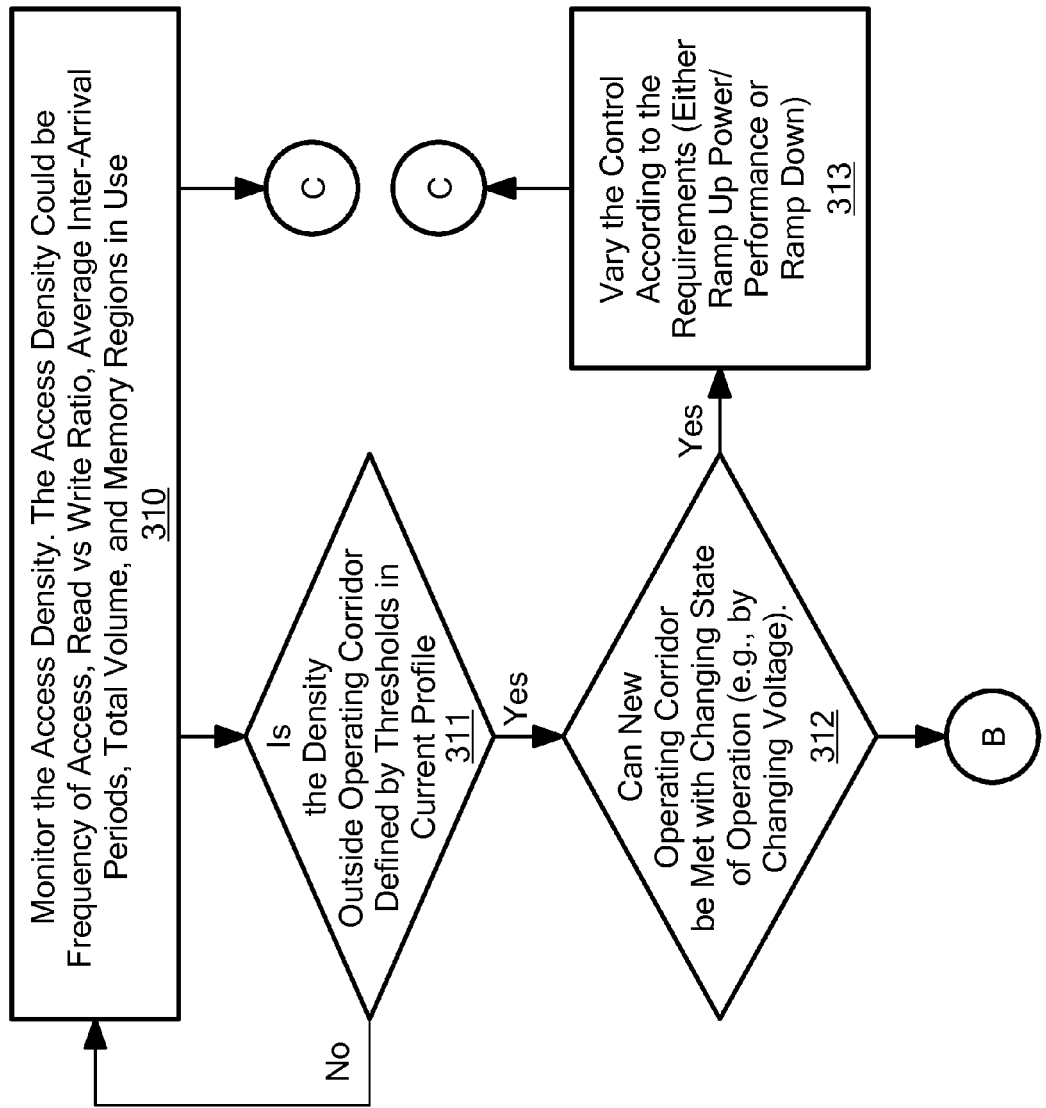
Figure 3C:
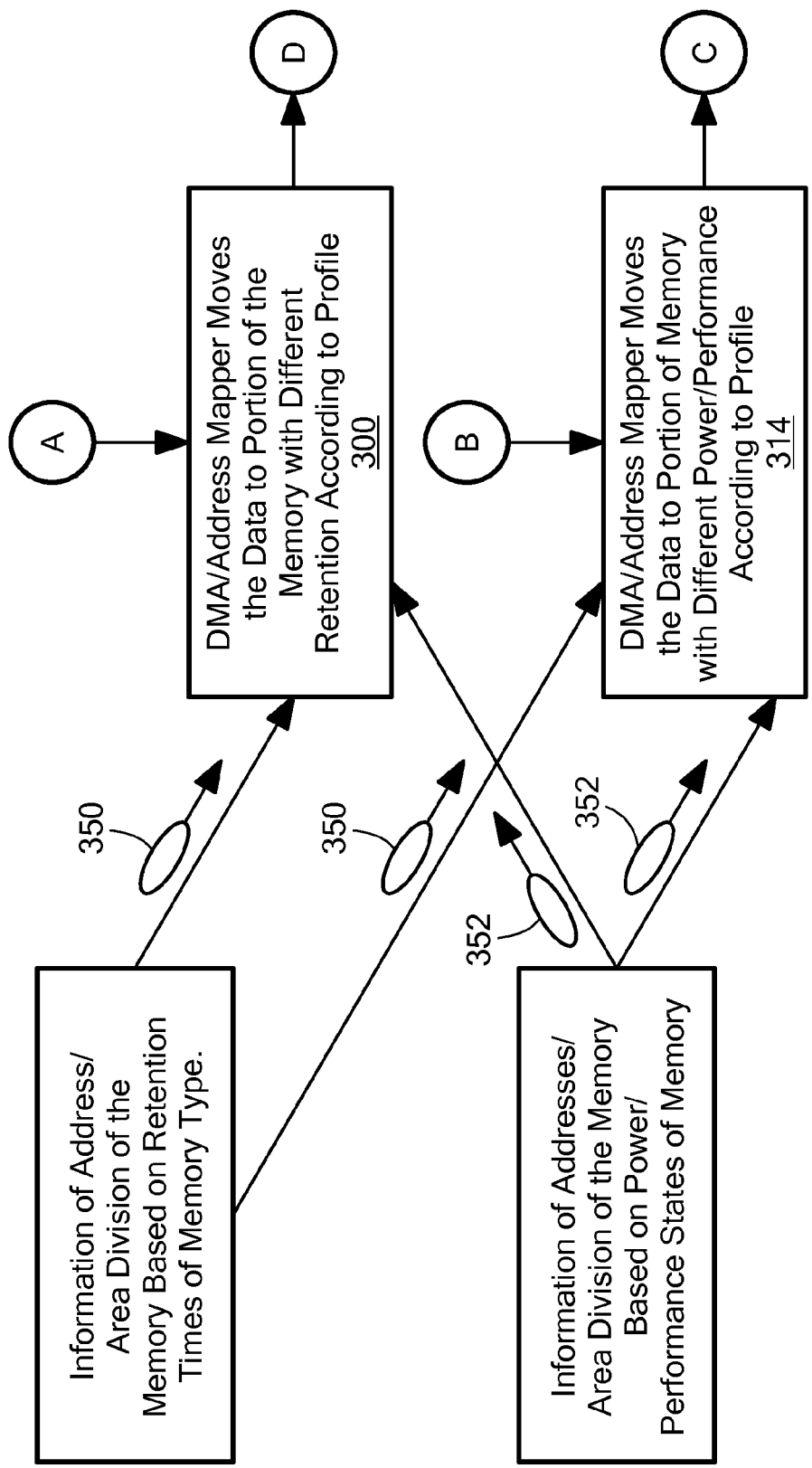
Figure 3D:
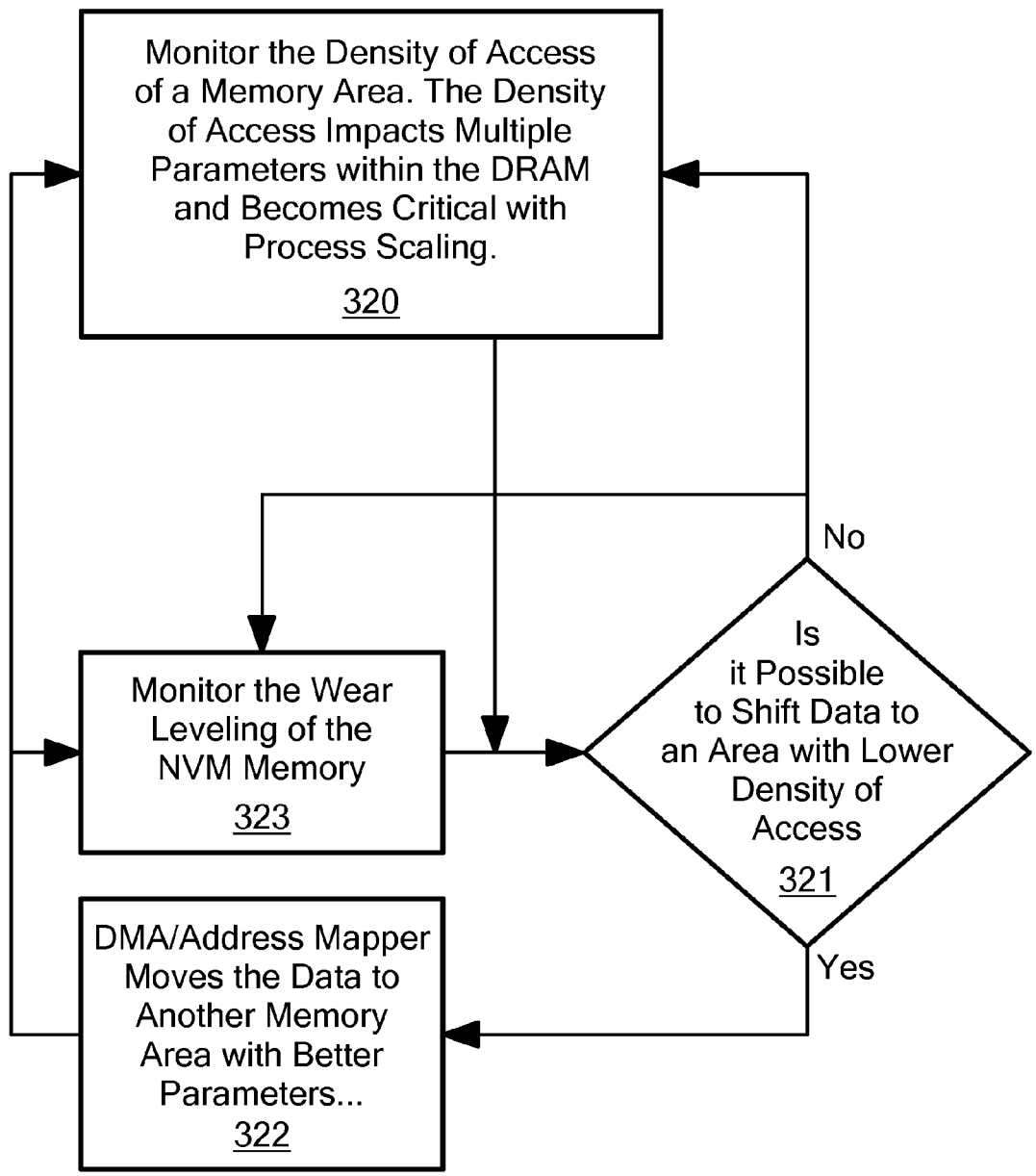

At step 310, in FIG. 3b, the logic 112 monitors the access density, referring to access frequency, read/write ratio, average inter-arrival period, total volume, or memory areas in use, generally referring to a usage or utilization rate. Such an attribute generally refers to overall power drain and corresponding heat generation, which may be a particular concern in a smaller, portable device. A check is performed, at step 311, to determine if the access density is outside the operating corridor (range). If so, a further check is performed to identify if a new operating corridor can be met by changing state of operation (i.e. by reducing voltage to reduce overall heat/power demand), as depicted at step 312. If so, the logic 112 sets the new operating corridor to vary the control by ramping up or ramping down performance, as shown at step 313. If a new operating corridor cannot be met (without drastically interrupting the usage), then the memory controller moves the data to areas 150 of memory with different power/performance (i.e. efficiency) states according to the profile, as depicted at step 314. It is generally less overhead to change state by modifying voltage than to move areas of memory, so voltage changes are considered first. The heuristic 112 may therefore maintain counters for accesses to areas, and redirect memory usage from areas having a high access to areas having a lower count of access.

For both cases where area movement is sought (steps 302,314), statistical usage data gathered from memory sensors and/or counters may be employed. Information of address/area division of the memory based on retention times of the memory type is sent to the logic, as shown by message 350. Similarly, information of addresses/area division of the memory based on power/performance states of memory is received by message 352. Therefore, the expected usage of the data is based on at least one of frequency of access of the data, expediency in retrieval of the data, and longevity of the data. Area 150 selection further includes identifying an operating mode, in which the operating mode is indicative of a priority of the attributes such that areas exhibiting a higher priority attribute are favored. The MC 110, responsive to the logic 112, maps the data based on the priority of attributes, in which areas 150 exhibiting attributes corresponding to the high priority are favored and areas exhibiting attributes corresponding to a lower priority are employed less frequently, or moved altogether between areas.

Therefore, the logic 112 implements heuristics which may include receiving operating statistics from the plurality of memory areas 150, in which the attributes are based on the received operating statistics. In the example arrangement, the operating statistics may include parameters such as temperature (i.e. thermal effects), statistic counters (i.e. frequency of access and address distribution) and timeout counters from onboard sensors in the memory banks/modules.

At step 320, the logic 112 monitors the density of access of a memory area 150. The density of access impacts multiple attributes (parameters) within DRAM, for example, and becomes more significant with process scaling. The logic also monitors the wear leveling of the NVM memory, as depicted at step 323. Wear leveling attempts to moderate access cycles across memory such that certain locations do not incur a disproportional share of accesses, which can cause some locations to exhaust their read/write lifecycle prematurely. For both attributes, a check is performed to determine if it is possible to shift data to an area 150 with lower density of access, as depicted at step 321. If so, the MC 110 moves the data to another memory area 150 having more tolerance to access cycles (more read/write longevity available). Therefore, the mapping may further invoke a heuristic for receiving timer input corresponding to data retention times, and identify data approaching a limit if retention time for the area 150 in which it resides. The MC 110 redirects memory usage to areas having higher retention times based on the received timer input.

Figure 4:
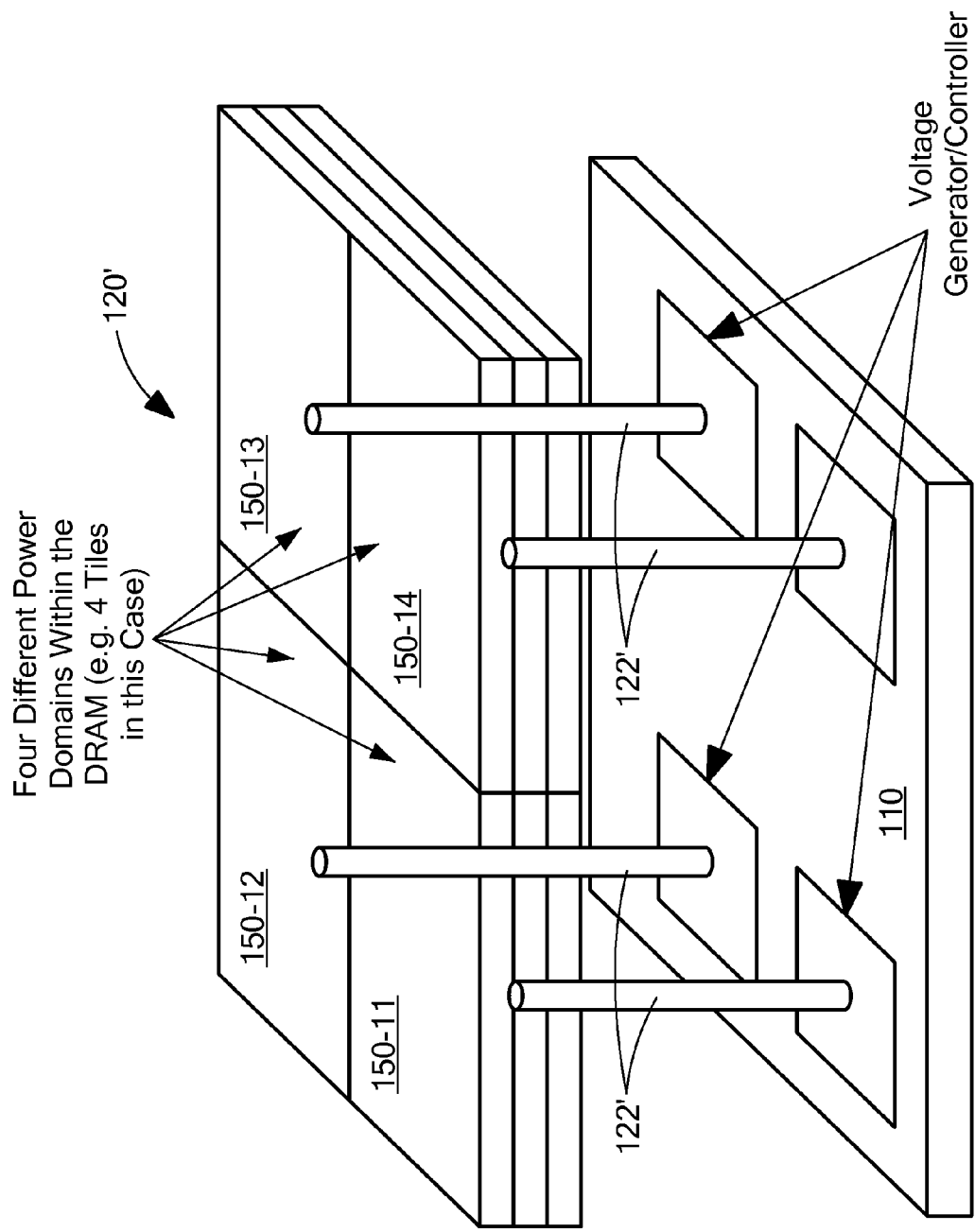
FIG. 4 shows a stacked implementation of memory areas in the environment of FIG. 1.

FIG. 4 shows a stacked implementation of memory areas in the environment of FIG. 1. Referring to FIGS. 1 and 4, differing architectures may dispose memory areas with different access mediums, such as TSVs (Through Silicon Vias) 122'. In alternate configurations, the areas 150 include TSV areas 150-11 . . . 150-14 accessible from stacked die memory arrangements 120' and bus accessible banks, as above. Further, different areas may correspond to different power domains, further enhancing the control of power consumption and heat generation.

Those skilled in the art should readily appreciate that the programs and methods defined herein are deliverable to a user processing and rendering device in many forms, including but not limited to a) information permanently stored on non-writeable storage media such as ROM devices, b) information alterably stored on writeable non-transitory storage media such as floppy disks, magnetic tapes, CDs, RAM devices, and other magnetic and optical media, or c) information conveyed to a computer through communication media, as in an electronic network such as the Internet or telephone modem lines. The operations and methods may be implemented in a software executable object or as a set of encoded instructions for execution by a processor responsive to the instructions. Alternatively, the operations and methods disclosed herein may be embodied in whole or in part using hardware components, such as Application Specific Integrated Circuits (ASICs), Field Programmable Gate Arrays (FPGAs), state machines, controllers or other hardware components or devices, or a combination of hardware, software, and firmware components.

While the system and methods defined herein have been particularly shown and described with references to embodiments thereof, it will be understood by those skilled in the art that various changes in form and details may be made therein without departing from the scope of the invention encompassed by the appended claims.

What is claimed is:

1. A method for accessing memory comprising:
   partitioning memory into a plurality of areas, each area defined by attributes, the areas being TSV (Through Silicon Via) areas accessible from stacked die arrangements;
   characterizing data according to an expected usage of the data; and
   selecting an area of the plurality of areas in which to store the data based on the expected usage of the data, each area of the partitioned memory remaining addressable from a memory controller in the same manner without regard to the memory area in which the data is stored.

2. The method of claim 1 wherein the expected usage of the data is based on at least one of frequency of access of the data, expediency in retrieval of the data, and longevity of the data.

3. The method of claim 1 wherein the data is storable and retrievable from any of the plurality of areas without explicit identification of the area from which the retrieval is performed.

4. The method of claim 1 further comprising dynamically modifying the attributes of the area in response to the expected usage.

5. The method of claim 4 further comprising:
identifying an access period and a retention period of area of memory; and
modifying a voltage attribute of the area such that the voltage level is modified according to the expected usage based on the needs of power consumption and speed.

6. The method of claim 5 further comprising modifying a voltage attribute of the area such that the voltage is lower during the retention period for maintaining the data and the voltage is higher during the access period for fast retrieval of the data.

7. The method of claim 1 further comprising identifying an operating mode, the operating mode indicative of a priority of the attributes such that areas exhibiting a higher priority attribute are favored; and
mapping the data based on the priority of attributes, such that areas exhibiting attributes corresponding to the high priority are favored and areas exhibiting attributes corresponding to a lower priority are employed less frequently.

8. A method for accessing memory comprising:
partitioning memory into a plurality of areas, each area defined by attributes;
characterizing data according to an expected usage of the data; and
selecting an area of the plurality of areas in which to store the data based on the expected usage of the data, wherein an operating mode prioritizes the plurality of areas for usage based on the attributes, the operating modes including:
a performance mode, the performance mode favoring memory areas having a fast retrieval;
an efficiency mode favoring memory areas having low power consumption with an acceptable retrieval time; and
a resilience mode favoring memory areas having high retention times for maintaining operation with minimal power and thermal stress while maintaining responsiveness.

9. The method of claim 8 wherein selecting includes mapping between the attributes and the expected usage wherein:
a performance attribute identifies the speed with which the data is recalled from an area of memory, and is employed for data frequently accessed in timing sensitive computations
a retention attribute identifies the duration which the data will remain in the area of memory without a power refresh, and is employed for data infrequently accessed in latency tolerant computations; and
an efficiency attribute indicates a power consumption for maintaining the data in the area of memory, and is employed when heat or battery considerations limit memory access.

10. The method of claim 7 further comprising receiving operating statistics from the plurality of memory areas, wherein the attributes are based on the received operating statistics.

11. The method of claim 10 wherein the operating statistics include temperature, statistic counters and timeout counters.

12. The method of claim 7 wherein the mapping further comprises invoking a heuristic for:
receiving sensor feedback on a temperature of frequently accessed areas, and
redirecting memory usage to less frequently used areas based on the received sensor feedback.

13. The method of claim 7 wherein the mapping further comprises invoking a heuristic for:
maintaining counters for accesses to areas; and
redirecting memory usage from areas having a high access count to areas having a lower count of access.

14. The method of claim 7 wherein the mapping further comprises invoking a heuristic for:
receiving timer input corresponding to data retention times;
identifying data approaching a limit if retention time for the area in which it resides; and
redirecting memory usage to areas having higher retention times based on the received timer input.

15. The method of claim 1 wherein the areas TSV (Through Silicon Via) areas are accessible from bus accessible banks.

16. A memory controller comprising:
a memory subdivided into a plurality of memory areas, each area defined by attributes;
heuristic logic operable to characterize data according to an expected usage of the data; and
a memory access medium for mapping the data to an area of the plurality of areas based on correlation of the expected usage with the attributes of the area, each area of the partitioned memory remaining addressable from a memory controller in the same manner without regard to the memory area in which the data is stored, the memory access medium configured to:
Identify, based on memory sensor input, an area of memory exhibiting a need for power correction; and
modify the attributes of the area for reducing power consumption and heat generation in response to the identified high temperature; and
a display for rendering the mapped data.

17. The controller of claim 16 wherein the expected usage of the data is based on at least one of frequency of access of the data, expediency in retrieval of the data, and longevity of the data.

18. The controller of claim 16 wherein each area of the partitioned memory remains addressable from a memory controller in the same manner without regard to the memory area in which the data is stored.

19. The controller of claim 16 wherein the memory areas are configured for dynamic modification of the attributes in response to the expected usage.

20. The controller of claim 16 wherein the heuristic defines an operating mode, the operating mode indicative of a priority of the attributes such that areas exhibiting a higher priority attribute are favored; and the memory access medium is responsive to the heuristic logic for mapping the data based on the priority of attributes, such that areas exhibiting attributes corresponding to the high priority are favored and areas exhibiting attributes corresponding to a lower priority are employed less frequently.

21. The controller of claim 16 wherein the heuristic logic includes operating modes for prioritizing the areas based on the attributes, the operating modes including:
   a performance mode, the performance mode favoring memory areas having a fast retrieval;
   an efficiency mode favoring areas having low power consumption with an acceptable retrieval time; and
   a resilience mode favoring areas having high retention times for maintaining operation with minimal power and thermal stress while maintaining responsiveness.

22. The controller of claim 16 wherein the heuristic is configured to map between the attributes and the expected usage is performed wherein:
   the performance attribute identifies the speed with which the data is recalled from an area of memory, and is employed for data frequently accessed in timing sensitive computations;
   the retention attribute identifies the duration which the data will remain in the area of memory without a power refresh, and is employed for data infrequently accessed in latency tolerant computations; and
   the efficiency attribute indicates a power consumption for maintaining the data in the area of memory, and is employed when heat or battery considerations limit memory access.

23. A computer program product on a non-transitory computer readable storage medium having instructions for performing a method for accessing memory, the method comprising:
   partitioning memory into a plurality of areas, each area defined by attributes;
   characterizing data according to an expected usage of the data; and
   mapping the data to an area of the plurality of areas based on correlation of the expected usage with the attributes of the area the expected usage, each area of the partitioned memory remaining addressable from a memory controller in the same manner without regard to the memory area in which the data is stored; identifying a future access period for data stored in the area of memory; and
   moving the data to an alternate area of memory prior to the access period, the alternate area having attributes corresponding to fast access in response to data having infrequent use but a need for fast access during use.

* * * * *